(12) United States Patent
Svenonius

(10) Patent No.: US 9,117,725 B2
(45) Date of Patent: Aug. 25, 2015

(54) PIXEL STRUCTURES FOR OPTIMIZED X-RAY NOISE PERFORMANCE

(75) Inventor: Olof Svenonius, Djursholm (SE)

(73) Assignee: SCINT-X AB, Kista (SE)

( * ) Notice: Subject to any disclaimer, the term of this patent is extended or adjusted under 35 U.S.C. 154(b) by 441 days.

(21) Appl. No.: 13/640,110

(22) PCT Filed: Apr. 1, 2011

(86) PCT No.: PCT/SE2011/050389
§ 371 (c)(1),
(2), (4) Date: Oct. 9, 2012

(87) PCT Pub. No.: WO2011/126434
PCT Pub. Date: Oct. 13, 2011

(65) Prior Publication Data
US 2013/0026375 A1    Jan. 31, 2013

Related U.S. Application Data

(60) Provisional application No. 61/322,579, filed on Apr. 9, 2010.

(51) Int. Cl.
*H01L 27/146* (2006.01)
*H01L 31/06* (2012.01)
*H01L 29/04* (2006.01)

(52) U.S. Cl.
CPC .... *H01L 27/14658* (2013.01); *H01L 27/14663* (2013.01); *H01L 29/04* (2013.01); *H01L 31/06* (2013.01)

(58) Field of Classification Search
CPC ....... H01L 31/06; H01L 31/062; H01L 27/00; H01L 29/04
See application file for complete search history.

(56) References Cited

U.S. PATENT DOCUMENTS

| | | | |
|---|---|---|---|
| 7,151,287 B1 * | 12/2006 | Scheffer et al. | 257/292 |
| 2002/0063199 A1 * | 5/2002 | Kozuka | 250/214.1 |
| 2003/0209712 A1 | 11/2003 | Fujita et al. | |
| 2004/0135063 A1 | 7/2004 | Dosluoglu | |
| 2006/0186505 A1 | 8/2006 | Adkisson et al. | |

(Continued)

FOREIGN PATENT DOCUMENTS

| | | |
|---|---|---|
| EP | 0915616 | 5/1999 |
| EP | 1032049 | 8/2000 |

(Continued)

OTHER PUBLICATIONS

Extended European Search Report, dated Sep. 30, 2013, from corresponding EP application.
International Search Report dated Jul. 11, 2011, corresponding PCT/SE2011/050389.

*Primary Examiner* — Casey Bryant
(74) *Attorney, Agent, or Firm* — Young & Thompson

(57) ABSTRACT

There is provided a pixel (100) for an image sensor, wherein the pixel (100) is based on a doped substrate (110) on which a lightly doped epitaxial layer (120) is provided. A photosensitive structure (130) and an isolating reversely biased well (140) are defined in the epitaxial layer, and the photosensitive structure (130) is encapsulated in the reversely biased well (140). Alternatively, or as a complement, the pixel (100) includes isolating wells extending on respective sides of the photosensitive structure (130) throughout the entire or at least a major part of the epitaxial layer to provide isolation from neighboring pixels of the image sensor.

13 Claims, 6 Drawing Sheets

(56) References Cited

U.S. PATENT DOCUMENTS

| | | |
|---|---|---|
| 2006/0291115 A1 | 12/2006 | Song et al. |
| 2007/0018264 A1 | 1/2007 | Rhodes et al. |
| 2007/0029589 A1 | 2/2007 | Bahl et al. |
| 2007/0102780 A1 | 5/2007 | Luo |
| 2009/0314947 A1 | 12/2009 | Goushcha et al. |

FOREIGN PATENT DOCUMENTS

| | | |
|---|---|---|
| EP | 1172857 | 1/2002 |
| JP | 2004319576 | 11/2004 |
| WO | 2007024855 | 3/2007 |
| WO | 2008129433 A2 | 10/2008 |

* cited by examiner

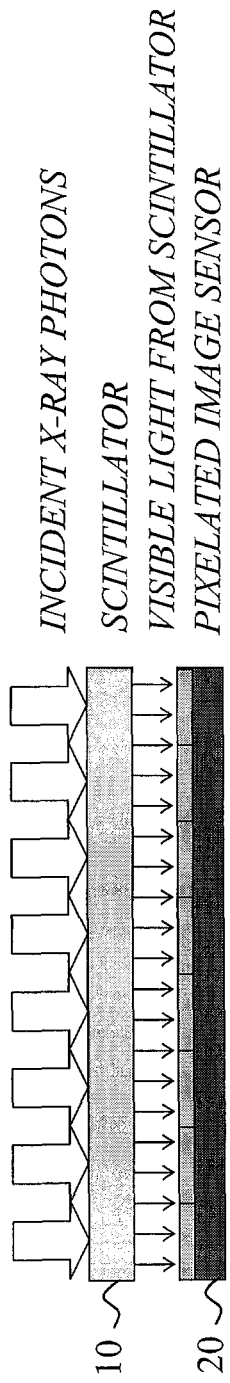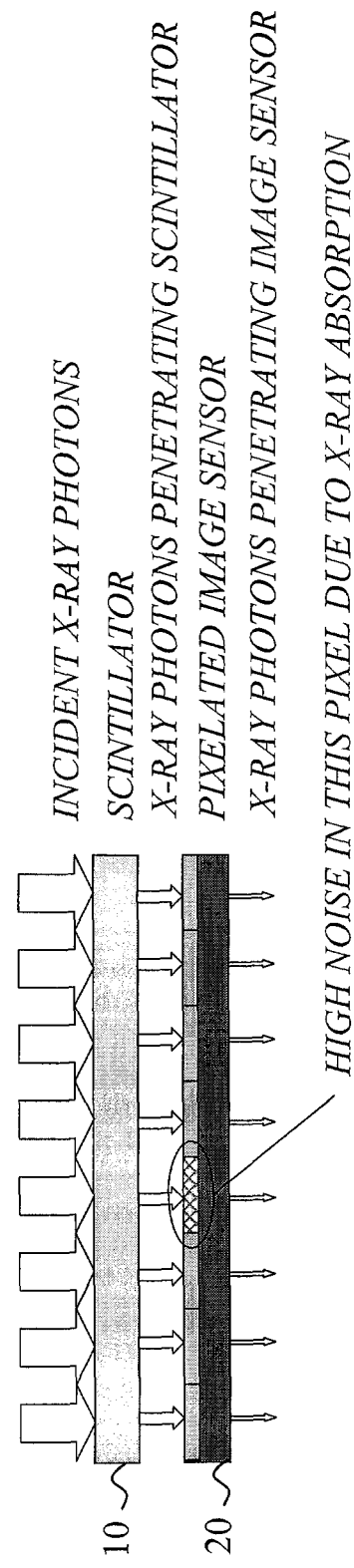
Fig. 1A
Fig. 1B

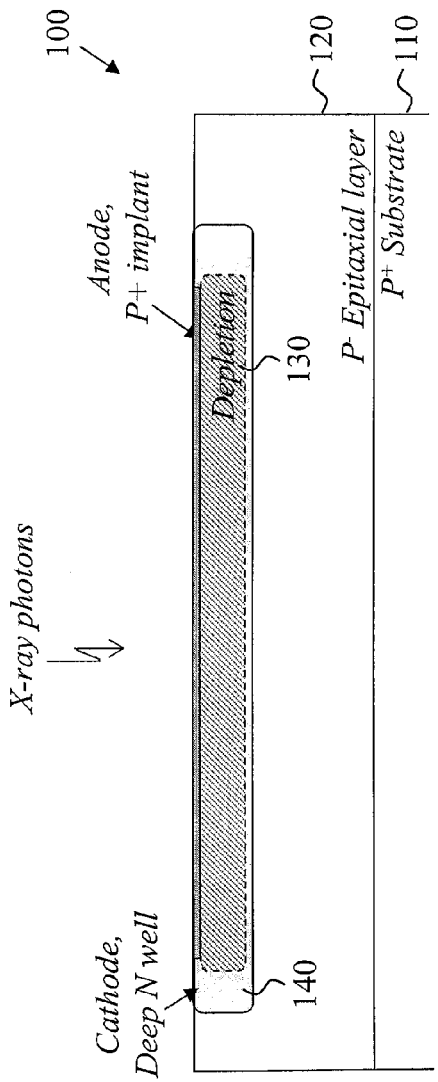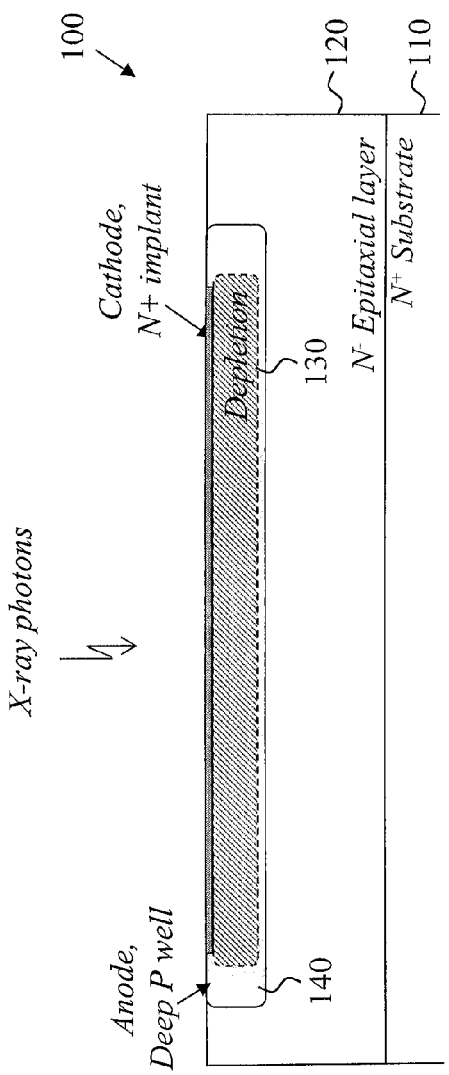

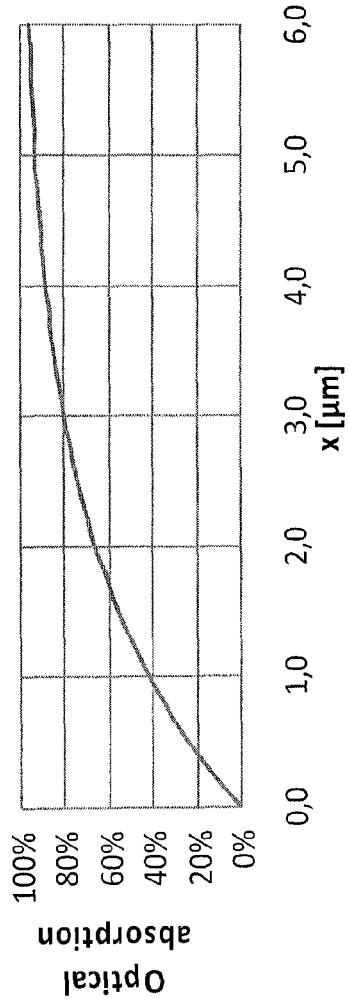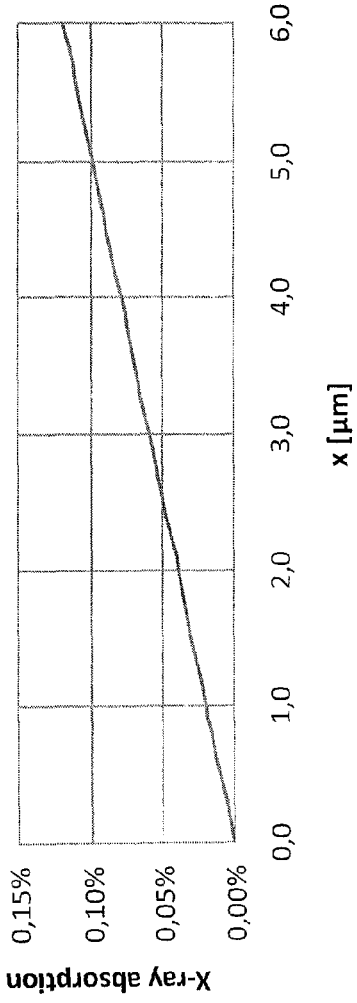
*Fig. 5A*  *Fig. 5B*

PIXEL STRUCTURES FOR OPTIMIZED X-RAY NOISE PERFORMANCE

TECHNICAL FIELD

The invention generally relates to x-ray imaging, and more particularly to situations where a scintillator and a pixelated image sensor are used in combination to capture an x-ray image.

BACKGROUND

It is common practice to use a scintillator in combination with an image sensor to capture x-ray images. In such a setup, the image sensor is placed behind the scintillator. However, by laws of nature, the scintillator can only absorb a certain fraction of all x-ray photons that enter the scintillator's surface. As a consequence, a number of non-absorbed x-ray photons penetrate through the scintillator and continue onto the image sensor. Some of these x-ray photons are absorbed in the image sensor, which typically results in significant noise, affecting one or several pixels in the neighborhood of the location where the x-ray photon was absorbed.

It is a general requirement in x-ray imaging to achieve the best possible image quality, often interpreted as the balance between high resolution (sharpness) and low noise. These two image requirements are typically contradictory so that high resolution often is accompanied by high noise and vice versa. The noise generated by absorption of x-ray photons in the image sensor, as explained in the previous paragraph, cannot be easily filtered without degrading the resolution (sharpness) in the image.

Sometimes a fiberoptic plate (FOP) made of x-ray-absorbing glass is placed between the scintillator and the image sensor in order to absorb x-ray photons that penetrate through the scintillator, thereby reducing noise. However, this solution is costly and increases the overall thickness and weight of the system, which is many times undesired.

SUMMARY

The present invention overcomes these and other drawbacks of the prior art.

It is a general object to provide an improved image quality by reducing the noise generated by the absorption of x-ray photons in the image sensor.

It is an object to provide an improved pixel for an image sensor.

It is also an object to provide an improved image sensor, an x-ray sensor system, and an x-ray imaging system.

In a first aspect, there is provided a pixel for an image sensor, wherein the pixel is based on a doped substrate on which a lightly doped epitaxial layer is provided. A photosensitive structure and an isolating reversely biased well are defined in the epitaxial layer, and the photosensitive structure is encapsulated in the reversely biased well.

In this way, the probability of x-ray interaction will be reduced, while maintaining enough depth for sufficient absorption of visible photons.

In a second aspect, there is provided a pixel for an image sensor, wherein the pixel is based on a doped substrate on which a lightly doped epitaxial layer is provided. A photosensitive structure is defined in the epitaxial layer, and the pixel comprises isolating wells extending on respective sides of the photosensitive structure throughout the entire or at least a major part of the epitaxial layer to provide isolation from neighboring pixels of the image sensor.

In this way, the noise of an absorbed x-ray is substantially contained to one pixel only.

The invention also provides an image sensor, an x-ray sensor system, and an x-ray imaging system.

The invention is generally applicable in x-ray imaging applications, and particularly useful in the following technical applications: Dental x-ray, industrial x-ray applications, and scientific x-ray applications.

Other advantages of the invention will be appreciated when reading the below detailed description.

BRIEF DESCRIPTION OF THE DRAWINGS

The invention, together with further objects and advantages thereof, may best be understood by making reference to the following description taken together with the accompanying drawings, in which:

FIGS. 1A-B illustrate a cross section of an example of a scintillator and an image sensor with pixels, showing the wanted function (FIG. 1A) and the unwanted process generating noise (FIG. 1B).

FIG. 3A is a schematic diagram illustrating a first example of pixel according to an embodiment of the invention.

FIG. 3B is a schematic diagram illustrating a second example of pixel according to an embodiment of the invention.

FIG. 5A is a schematic diagram illustrating an example of the percentage of optical absorption, as a function of the depth x from the surface. The useful signal S is considered proportional to this optical absorption.

FIG. 5B is a schematic diagram illustrating an example of the percentage of x-ray absorption, as a function of the depth x from the surface. The noise N generated by thus absorbed x-ray photons is considered proportional to this x-ray absorption. Other noise mechanisms exist but are not considered here.

DETAILED DESCRIPTION

Figure 2:
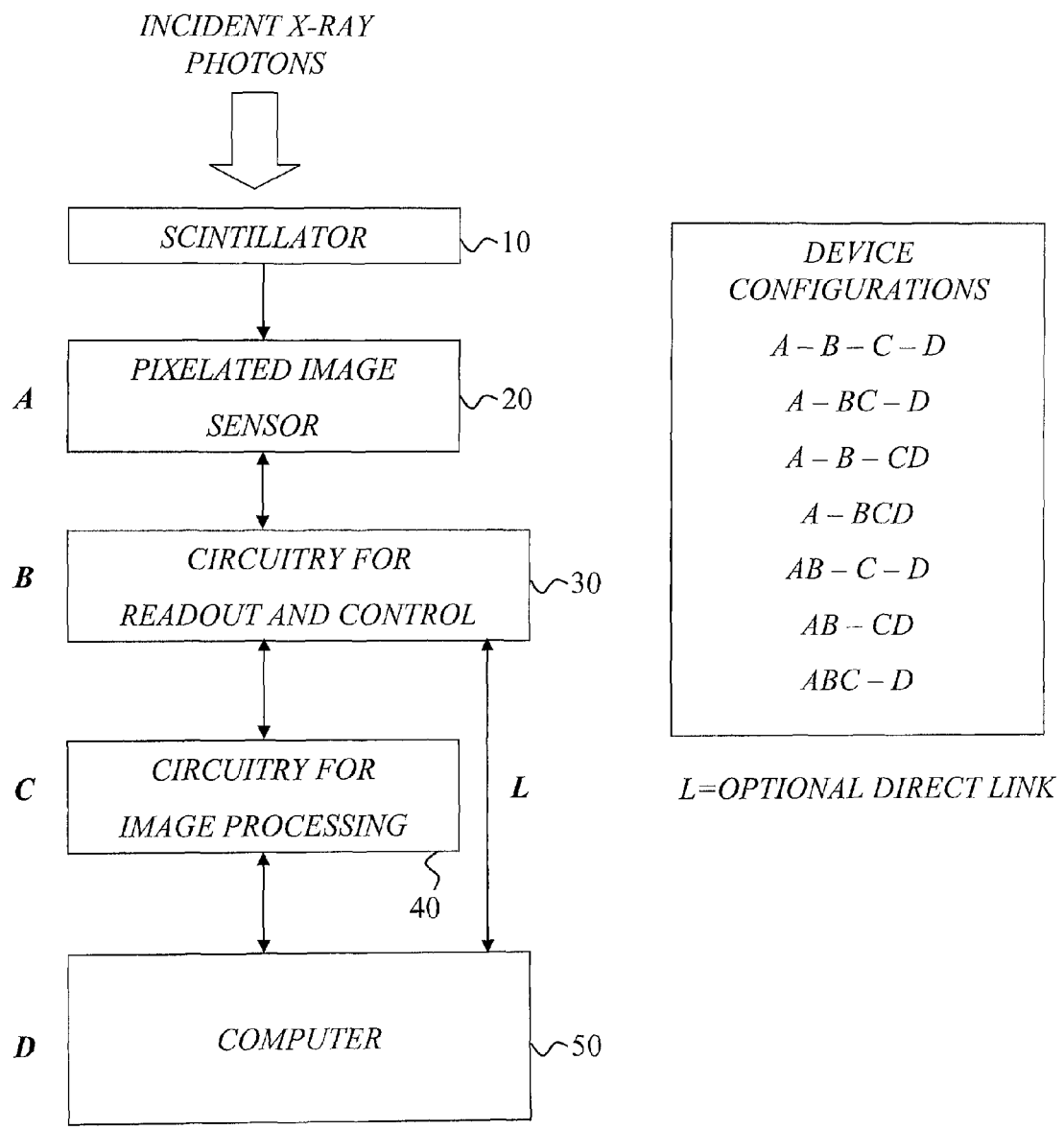
FIG. 2 is a schematic block diagram illustrating an example of a typical setup, including a scintillator, an image sensor (A), circuitry for readout and control (B), circuitry for image processing (C) and a computer (D). Possible device configurations are shown to the right, where hyphen ("-") denotes separation between devices.

Throughout the drawings, the same reference numbers are used for similar or corresponding elements.

The invention will now be described with reference to some exemplary and non-limiting embodiments.

FIGS. 1A-B illustrate an example of a scintillator and an image sensor in a typical configuration for x-ray imaging.

FIG. 1A illustrates the wanted function of the configuration with x-ray absorption and light emission in the scintillator 10, and absorption of visible light in the image sensor 20. FIG. 1B illustrates the unwanted process of the configuration with x-ray photons penetrating the scintillator 10 and being absorbed in the image sensor 20. The desired function of this setup is shown in FIG. 1A: The scintillator absorbs x-ray photons and, for each such x-ray photon, emits a burst of photons in the visible range, thus generating a light image that can be captured by a light-sensitive image sensor such as a charge-coupled device (CCD) or CMOS imaging sensor (CIS). However, by laws of nature, a scintillator can only absorb a certain fraction of x-ray photons that enter the scintillator's surface. As a consequence, as shown in FIG. 1B, a number of non-absorbed x-ray photons penetrate through the scintillator and continue onto the image sensor. Some of these x-ray photons are absorbed in the image sensor, which typically results in high noise affecting one or several pixels in the neighborhood of the location where the x-ray photon was absorbed.

The invention at least partly relates to a method and device for minimizing the probability of interaction between an oncoming x-ray photon and the photosensitive pixel; it also relates to a method and device of containing the noise signal generated by such an absorbed x-ray photon to the one single pixel where absorption took place.

In a first aspect, there is provided a pixel for an image sensor, wherein the pixel is based on a doped substrate on which a lightly doped epitaxial layer is provided. A photosensitive structure and an isolating reversely biased well are defined in the epitaxial layer, and the photosensitive structure is encapsulated in the reversely biased well.

For example, the photosensitive structure may be defined by a depletion region in which light is converted to electrical carriers that constitute a signal, and the depletion region is preferably contained in its entirety within the reversely biased well to reduce the risk for carriers generated by absorption of x-ray photons outside of the depletion region from contributing, or adding, noise to the signal.

Preferably, the photosensitive structure is made shallow to reduce the probability of x-ray interaction in the photosensitive structure while maintaining enough depth for sufficient absorption of visible photons.

In a second aspect, there is provided a pixel for an image sensor, wherein the pixel is based on a doped substrate on which a lightly doped epitaxial layer is provided. A photosensitive structure is defined in the epitaxial layer, and the pixel comprises isolating wells extending on respective sides of the photosensitive structure throughout the entire or at least a major part of the epitaxial layer to provide isolation from neighboring pixels of the image sensor.

For example, the photosensitive structure may be defined by a depletion region in which light is converted to electrical carriers that constitute a signal.

The isolating wells may, by way of example, be implemented as etched wells or reversely doped wells.

An image sensor may thus be designed having a number of pixels constructed according to any of the above aspects.

An x-ray sensor system may also be provided comprising a scintillator arranged in combination with such an image sensor, and an overall x-ray imaging system comprising such an x-ray sensor system may be provided.

In the first aspect it is desirable to construct the image sensor in such a way that the probability for absorption of x-ray photons is reduced. A basic idea is thus to construct the image sensor in such a way that the probability for an x-ray photon to interact with the image sensor, thereby generating noise, is minimized or at least reduced.

The image sensor may for example be constructed in such a way that the photosensitive structure within each picture element ("pixel") is made as shallow as possible to minimize or at least reduce the probability of x-ray interaction, while maintaining enough depth for sufficient absorption of visible photons from the scintillator.

In the second aspect it is desirable to construct the image sensor in such a way that the noise generated by an absorbed x-ray photon is substantially contained to one pixel only. As an alternative or at least partly as a complement, an isolating structure around the photosensitive structure in each pixel, electrical or otherwise, can be provided to ensure that the noise signal generated by an absorbed x-ray photon is substantially contained to one pixel only.

The invention offers at least one of the following advantages:

Improved pixel structures.

Improved x-ray noise performance.

The ability to capture x-ray images of high resolution and low noise with a small and light-weight x-ray sensor system.

The invention may produce results similar to those achieved with a fiberoptic plate (FOP), in particular when used in combination with an appropriate filter.

The structure of the photosensitive part of the pixel may for example be implemented in a CMOS-based image sensor. As such it may be part of a system comprising a scintillator, an image sensor and a suitable processing device such as a computer or Digital Signal Processor (DSP), and/or any programmable logic device such as Field Programmable Gate Array (FPGA) and Programmable Logic Controller (PLC) devices. Filtering techniques may further enhance the overall performance of such system.

WO 03/026007 relates to a CMOS pixel design for minimization of defect-induced leakage current. This is not the same design or objective problem as that of the present invention.

Preferably, the method and device are implemented by means of a photosensitive structure encapsulated in isolation and/or with isolation between pixels, as will be exemplified later on.

The noise characteristics of a captured image may be interpreted as the signal-to-noise ratio (SNR), and the x-ray resilient pixel structure may thus be regarded as an SNR-improving feature of the image sensor.

FIG. 2 is an exemplary block diagram of a typical setup, including a scintillator 10, an image sensor 20 (A), circuitry 30 for readout and control (B), circuitry 40 for image processing (C) and a computer 50 (D). Possible device configurations are shown to the right, where hyphen ("-") denotes separation between devices. As indicated there exist a wide variety of different possible device configurations.

The image sensor 20 is preferably a pixelated image sensor having a number of pixels.

It should also be understood that circuitry 20 and 30 (A and B) may be integrated. Alternatively, circuitry 30 and 40 (B and C) may be integrated, or all of circuitry 20, 30 and 40 (A, B and C) may be integrated. It is also possible to integrate circuitry 30 and/or 40 (B and/or C) in the computer 50 (D). The direct link "L" between circuitry 30 (B) and circuitry 50 (D) is optional. In FIG. 2, bi-directional arrows indicate bi- or unidirectional communication.

In the following, the invention will be described in more detail with reference to the illustrative, non-limiting examples of FIGS. 3 and 4.

For example, the photosensitive structure within each picture element ("pixel") is made as shallow as possible to minimize or at least reduce the probability of x-ray interaction, while maintaining enough depth for sufficient absorption of visible photons from the scintillator. This may be realized by containing/encapsulating the photosensitive structure, e.g. defined by the depletion region, within a reversely biased well, as will be exemplified below.

FIGS. 3A-B are schematic diagrams showing different examples of a pixel structure 100, e.g. implemented in a CMOS structure, with a "shallow" photosensitive structure 130 encapsulated in a reversely biased well 140, which also provides isolation between pixels. The photosensitive structure/depletion region 130 and the isolating reversely biased well 140 are defined in the epitaxial layer 120 provided on top of the substrate 110. Light from the scintillator is captured and converted to electrons in the depletion region 130. The lightly doped epitaxial layer 120 shown on top of the substrate 110 is a standard feature in most CMOS processes.

FIG. 3A shows an example of a structure for a substrate with p-type doping; a shallow pixel structure, isolated by a reversely biased well, on a P type substrate.

FIG. 3B shows an example of a structure for a substrate with n-type doping; a shallow pixel structure, isolated by reversely biased well, on an N type substrate.

The cross-section of an example of a photosensitive structure within a pixel is shown. Light is converted to electrical carriers in the depletion region 130; these carriers constitute the signal in the image and are read out to a processing device after conclusion of each x-ray exposure. The depletion region 130 is in its entirety contained within the deep, reversely biased N type well 140 (FIG. 3A) or P type well 140 (FIG. 3B) in order to ensure that carriers generated by absorption of x-ray photons outside of the depletion region 130 cannot contribute noise to the signal in any pixel. The depletion region 130 is typically referred to as a shallow depletion region because it is contained within the well 140.

In another example, isolation between pixels is provided by wells extending throughout the entire or at least a major part of the epitaxial layer, as will be exemplified below.

Figure 4A:
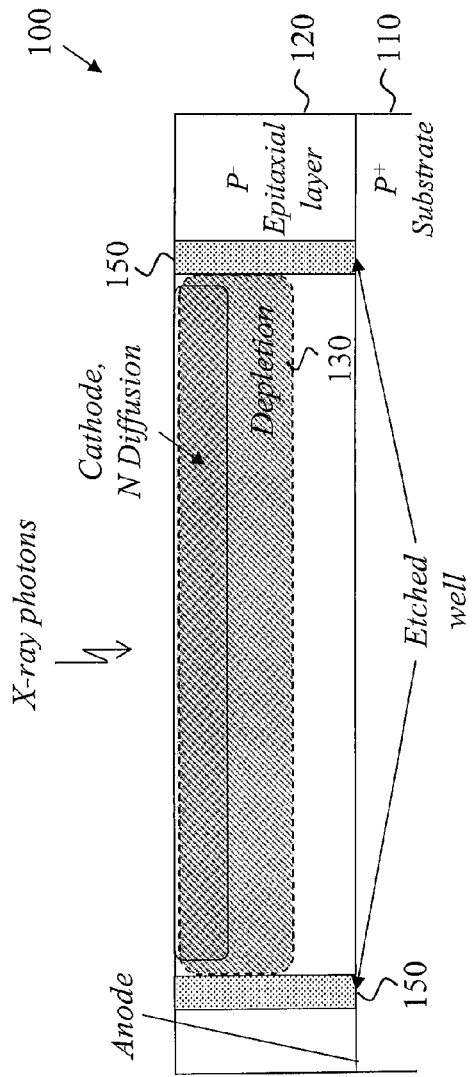
FIG. 4A is a schematic diagram illustrating a third example of pixel according to an embodiment of the invention.
Figure 4B:
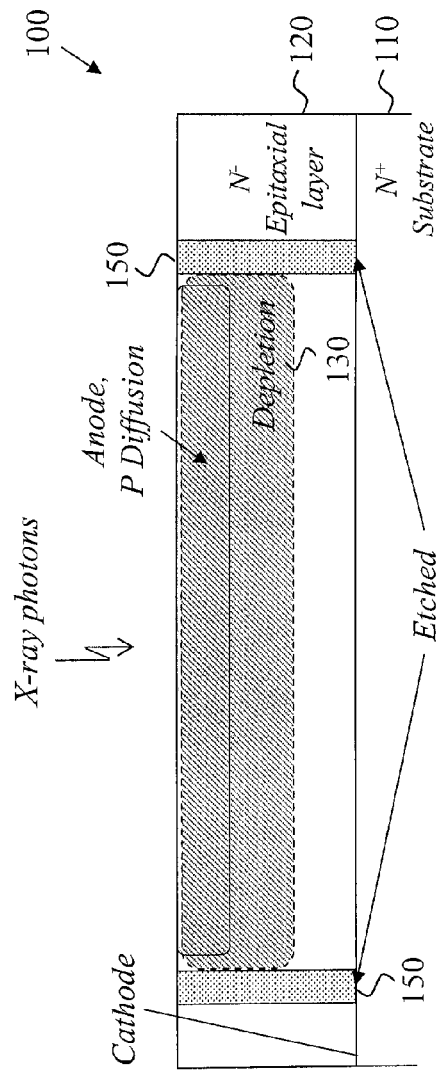
FIG. 4B is a schematic diagram illustrating a fourth example of pixel according to an embodiment of the invention.

FIGS. 4A-B are schematic diagrams showing different examples of a pixel structure 100, e.g. implemented in a CMOS structure, where the photosensitive structure 130 is defined in a thin epitaxial layer 120 and where isolation between pixels is provided by an etched well 150 between pixels. Light from the scintillator is captured and converted to electrons in the depletion region 130. The lightly doped epitaxial layer 120 shown on top of the substrate 110 is a standard feature in most CMOS processes.

FIG. 4A shows an example of a structure for a substrate with P type doping; a pixel structure on a thin epitaxial layer, isolated by etched wells, on a P type substrate.

FIG. 4B shows an example of a structure for a substrate with N type doping; a pixel structure on a thin epitaxial layer, isolated by etched wells, on an N type substrate In the same way as described previously, light is converted to electrical carriers in the depletion region 130, which are read out to a processing device after conclusion of each exposure. In this particular example, the depletion region 130 is isolated from neighboring pixels by etched wells 150, which ensure that x-ray photons absorbed in one pixel can contribute to a noise signal in that pixel only.

As an alternative to etched wells, reversely doped wells that also extend throughout the entire or at least a major part of the epitaxial layer 120 may be used.

It is also possible to combine the feature of a depletion region contained within a reversely biased well of FIGS. 3A-B and the isolating wells extending throughout the entire or at least a major part of the epitaxial layer of FIGS. 4A-B in order to obtain a highly isolated pixel structure.

FIG. 5A is a schematic diagram illustrating an example of the percentage of optical absorption, as a function of the depth x from the sensor's surface. The useful signal S is considered proportional to this optical absorption. For example, the useful signal may be expressed as: $S = k_1 \times Abs_o$, where $k_1$ is a coefficient relevant for optical absorption and $Abs_o$ is the optical absorption. This particular example refers to the absorption of light at a wavelength of 550 nm in silicon. As can be seen the absorption efficiency naturally increases with increased depth.

FIG. 5B is a schematic diagram illustrating an example of the percentage of x-ray absorption, as a function of the depth x from the sensor's surface. The noise N generated by thus absorbed x-ray photons is considered proportional to this x-ray absorption. For example, the noise N may be expressed as: $N = k_2 \times Abs_x$, where $k_2$ is a coefficient relevant for x-ray absorption and $Abs_x$ is the x-ray absorption. Other noise mechanisms exist but are not considered here. In this particular example the x-ray energy is 30 keV. As can be seen the undesired x-ray absorption also increases with increased depth.

It should be understood that the absorption of one visible photon normally generates one electron (in practice, the quantum efficiency is normally somewhat lower than 1), while the absorption of one x-ray photon may generate thousands of electrons.

There are thus somewhat conflicting requirements with respect to the depth or thickness of the photosensitive structure, which basically corresponds to the depth x. As mentioned, the photosensitive structure is preferably designed with a depth or thickness to reduce the probability of x-ray interaction while maintaining enough depth for sufficient absorption of visible photons.

Figure 6:
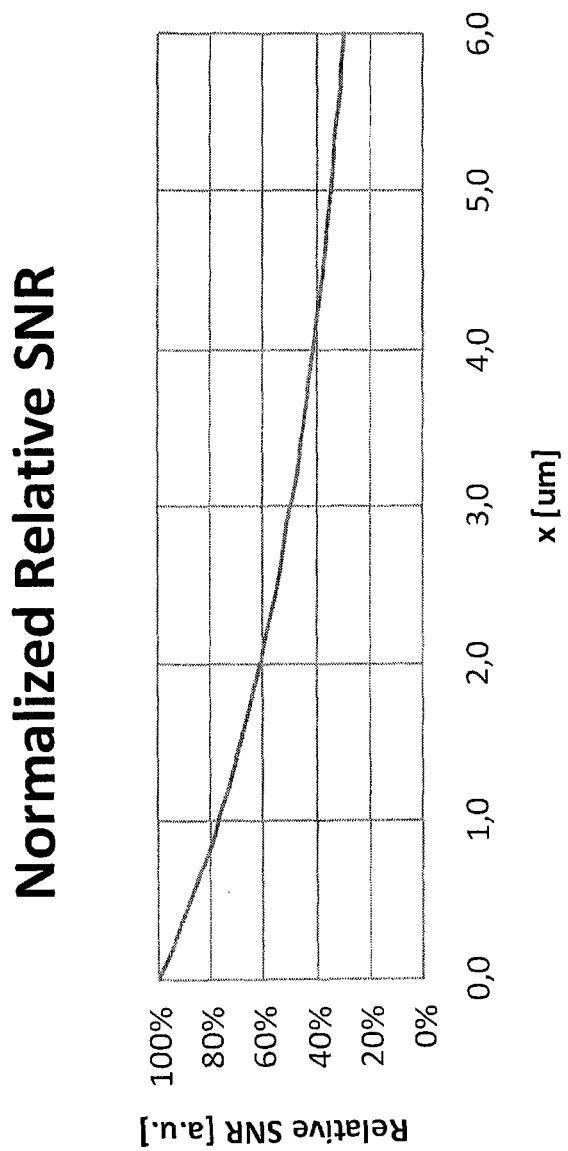
FIG. 6 is a schematic diagram illustrating an example of the normalized relative SNR (signal-to-noise ratio) between optical absorption and x-ray absorption as a function of the depth x from the surface.

FIG. 6 is a schematic diagram illustrating an example of the normalized relative SNR between optical absorption and x-ray absorption as a function of the depth x from the sensor's surface. The optical absorption is considered as the wanted signal S and the x-ray absorption is considered as a source of noise N, and the ratio between the two constitutes a relative signal-to-noise ratio SNR, which may be normalized.

The thickness of the epitaxial layer 120 is normally 5-6 µm, but may vary depending on the manufacturing process.

The thickness, or depth, of the photosensitive structure 130 should normally be smaller than about 4 µm to ensure that the x-ray absorption within the photosensitive structure stays around or below about 0.08%. It should though be understood that the depth of the photosensitive structure depends on the application.

In another example, the thickness of the photosensitive structure 130 should be smaller than about 3 µm to ensure a relative SNR that is higher than about 50%, and preferably smaller than about 2 µm to ensure a relative SNR that is higher than about 60%.

When the thickness is smaller than about 2 µm, the x-ray absorption will be lower than 0.04%, and the relative SNR will be higher than about 60%.

In many practical applications, the thickness of the photosensitive structure 130 should be larger than about 0.5 µm. In this way, the optical absorption will be at least around 25%.

However, this is not a strict requirement for all technical applications, and sometimes even thinner photosensitive structures can be used.

Some illustrative and non-limiting examples of the thickness or depth, x, of the photosensitive structure in practical implementations:

x<4 µm
x<3 µm
x<2 µm
0.5 µm<x<4 µm
0.5 µm<x<3 µm
0.5 µm<x<2 µm
1 µm<x<2 µm

The above proposed solutions support the use of a subsequent noise-reduction filter which may further enhance the performance. Such a noise-reduction filter or algorithm may e.g. be configured to reduce the noise generated by the absorption of x-ray photons in the image sensor, while substantially maintaining the resolution (sharpness) in the image. The filter may for example be implemented as a noise-reduction software algorithm for execution by a suitable processing device, or alternatively the noise-reduction algorithm is implemented in hardware. An example of a suitable filter is described in our co-pending patent application U.S. 61/222,602 filed Jul. 2, 2009, which is incorporated herein by reference.

The embodiments described above are to be understood as a few illustrative examples of the present invention. It will be understood by those skilled in the art that various modifications, combinations and changes may be made to the embodiments without departing from the scope of the present invention. In particular, different part solutions in the different embodiments can be combined in other configurations, where technically possible.

The invention claimed is:

1. An x-ray sensor system comprising:
a scintillator configured to absorb x-ray photons and emit photons in the visible range to thus generate a light image; and
an image sensor arranged in combination with said scintillator and configured to capture said light image, said image sensor including a pixel based on a doped substrate on which a lightly doped epitaxial layer is provided, an isolating reversely biased well being defined in said epitaxial layer, the reversely biased well being smaller than the epitaxial layer, a photosensitive structure being encapsulated in said reversely biased well, the photosensitive structure being smaller than the reversely biased well, said photosensitive structure being defined by a depletion region in which light from said scintillator is converted to electrical carriers that constitute a signal, said depletion region being contained in its entirety within said reversely biased well to reduce the risk for carriers generated by absorption of x-ray photons outside of the depletion region from contributing noise to the signal.

2. The x-ray sensor system of claim 1, wherein said photosensitive structure is configured having a depth or thickness that reduces the probability of x-ray interaction in the photosensitive structure while maintaining enough depth for sufficient absorption of visible photons.

3. The x-ray sensor system of claim 2, wherein said pixel further comprises additional isolating wells extending on respective sides of the photosensitive structure throughout the entire or at least a major part of the epitaxial layer to provide isolation from neighboring pixels of the image sensor.

4. An x-ray imaging system comprising an x-ray sensor system according to claim 2.

5. The x-ray sensor system of claim 1, wherein said pixel further comprises additional isolating wells extending on respective sides of the photosensitive structure throughout the entire or at least a major part of the epitaxial layer to provide isolation from neighboring pixels of the image sensor.

6. The x-ray sensor system of claim 5, wherein said isolating wells are etched wells or reversely doped wells.

7. An x-ray imaging system comprising an x-ray sensor system according to claim 6.

8. An x-ray imaging system comprising an x-ray sensor system according to claim 5.

9. An x-ray imaging system comprising an x-ray sensor system according to claim 1.

10. The x-ray sensor system of claim 1, wherein said photosensitive structure is configured having a depth or thickness that is smaller than 4 μm.

11. The x-ray sensor system of claim 1, wherein said photosensitive structure is designed with a depth or thickness that is larger than 0.5 μm.

12. The x-ray sensor system of claim 1, wherein said substrate is a P+ substrate, said epitaxial layer is a P− layer, said reversely biased well is an N well, and the anode of the pixel is a P+ implant.

13. The x-ray sensor system of claim 1, wherein said substrate is a N+ substrate, said epitaxial layer is a N− layer, said reversely biased well is a P well, and the cathode of the pixel is a N+ implant.

* * * * *